United States Patent
Taschner et al.

(10) Patent No.: US 10,010,017 B2
(45) Date of Patent: Jun. 26, 2018

(54) POTENTIAL EQUALIZATION IN A CONTROL DEVICE FOR A MOTOR VEHICLE

(71) Applicant: CONTI TEMIC MICROELECTRONIC GMBH, Nürnberg (DE)

(72) Inventors: Nikolaus Taschner, Bayreuth (DE); Bernhard Schuch, Neusitz (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 120 days.

(21) Appl. No.: 14/646,776

(22) PCT Filed: Sep. 26, 2013

(86) PCT No.: PCT/DE2013/200188
§ 371 (c)(1),
(2) Date: May 22, 2015

(87) PCT Pub. No.: WO2014/079421
PCT Pub. Date: May 30, 2014

(65) Prior Publication Data
US 2015/0289422 A1    Oct. 8, 2015

(30) Foreign Application Priority Data
Nov. 23, 2012   (DE) .................. 10 2012 111 334

(51) Int. Cl.
*H05K 7/10*    (2006.01)
*H05K 9/00*    (2006.01)
(Continued)

(52) U.S. Cl.
CPC ......... *H05K 9/0064* (2013.01); *H05K 1/0215* (2013.01); *H05K 1/0306* (2013.01);
(Continued)

(58) Field of Classification Search
USPC ........................................ 361/767, 752, 808
See application file for complete search history.

(56) References Cited

U.S. PATENT DOCUMENTS

| | | |
|---|---|---|
| 8,064,219 B2 | 11/2011 | Taniguchi |
| 2005/0079748 A1 | 4/2005 | Kim |
| 2009/0209114 A1* | 8/2009 | Luettermann ...... H01R 13/6485 439/59 |

FOREIGN PATENT DOCUMENTS

| | | |
|---|---|---|
| DE | 4428319 A1 | 4/1996 |
| EP | 2073261 A1 | 6/2009 |

(Continued)

OTHER PUBLICATIONS

ILME GMBH, "AP- and AC_Gehäuse aus Aluminiumdruckguss", Apr. 2009, URL: http://www.ilme.com/PDFCataloghi/DE/DE_AC-AP.pdf.

*Primary Examiner* — Andargie M Aychillhum
(74) *Attorney, Agent, or Firm* — Laurence A. Greenberg; Werner H. Stemer; Ralph E. Locher

(57) ABSTRACT

An arrangement for potential equalization in a control device for a motor vehicle includes at least one electrical component on a circuit carrier, a carrier structure on which the circuit carrier is arranged, and at least one contacting element that electroconductively connects the circuit carrier to the carrier structure by way of a connecting element that forms a potential equalization. The contacting element has a bondable surface coating.

15 Claims, 1 Drawing Sheet

(51) Int. Cl.
*H05K 1/02* (2006.01)
*H05K 1/03* (2006.01)
*H05K 3/24* (2006.01)
*H05K 1/11* (2006.01)
*H05K 7/06* (2006.01)

(52) U.S. Cl.
CPC ............ *H05K 1/111* (2013.01); *H05K 3/244* (2013.01); *H05K 7/06* (2013.01); *H05K 2201/10409* (2013.01); *H05K 2203/049* (2013.01); *Y10T 29/49224* (2015.01)

(56) References Cited

FOREIGN PATENT DOCUMENTS

| | | |
|---|---|---|
| JP | S63195977 A | 8/1988 |
| JP | 2001313094 A | 11/2001 |
| WO | 2008113323 A1 | 9/2008 |

\* cited by examiner

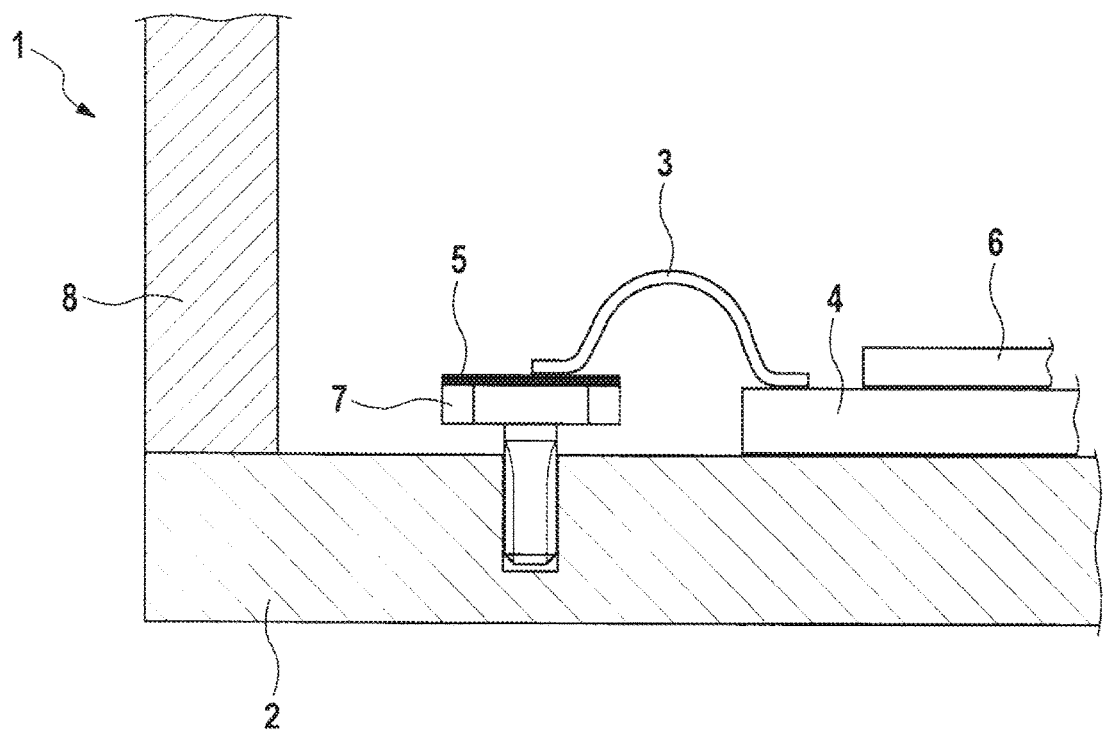

POTENTIAL EQUALIZATION IN A CONTROL DEVICE FOR A MOTOR VEHICLE

BACKGROUND OF THE INVENTION

Field of the Invention

The invention relates to an arrangement for potential equalization in a control device for a motor vehicle, to a method for establishing potential equalization in a control device, and also to a control device having a corresponding arrangement.

For a control device in a motor vehicle, a ground connection of the circuit carrier of the control device to the control device housing, or to the control device base plate, which is usually composed of aluminum, is particularly necessary for reasons of electromagnetic compatibility.

A ground bond is primarily required for reasons of electromagnetic compatibility in order to compensate for the ground offset between the transmission housing, that is to say the ground of the vehicle, and the control device. In this case, ground means the electrical reference potential for signaling and operating voltages in the vehicle or control device. Until now, a direct bonding connection from the circuit carrier to a base plate of the control device which is composed of aluminum has generally been provided for this purpose. To this end, the bonding area has to be mechanically processed. This results in additional production costs since otherwise no further processing is necessary here. One difficulty is that the bonding area can be soiled or the bonding area does not meet the requirements for the surface condition in respect of roughness, and therefore a secure bonding connection is not ensured, and this may require repair work.

The ground bond is usually placed directly onto the diecast aluminum base plate. In order to ensure bondability on the base plate, a mechanically processed area is necessary, for example a milled area. In particular, the base plate has to be washed for example with perchloroethylene, in particular degreased, in order to meet the strict requirements in respect of cleanliness and surface condition. This is an expensive and, in particular, environmentally harmful process.

BRIEF SUMMARY OF THE INVENTION

The invention is therefore based on the object of providing a control device for a motor vehicle and a method for producing said control device, in which method potential equalization of the circuit carrier with respect to the transmission housing is simplified.

This object is achieved by the features as claimed.

The core of the arrangement according to the invention is that at least one contact-making element which electrically conductively connects the circuit carrier to the carrier structure by means of a connecting element in order to establish potential equalization has a bondable surface coating.

In particular, this surface coating on the contact-making element comprises electrodeposited or chemically deposited material comprising aluminum, copper, silver or a compound such as nickel/gold, nickel/silver, nickel/palladium/gold or nickel/palladium/silver. In this case, the contact-making element can be entirely or else only partially coated, as a result of which one or else several defined bondable surfaces can advantageously be produced.

For the sake of simplicity, the coated contact-making element, which is connected to the carrier structure in a force-fitting or interlocking manner, is designed, for example, as a screw or rivet, wherein a screw can be fitted in a particularly simple manner.

The carrier structure is preferably in the form of at least part, in particular in the form of the base plate, of the control device housing, for example composed of aluminum.

The circuit carrier advantageously comprises a printed circuit board, in particular with a ceramic substrate, wherein, in particular, the connecting element between the circuit carrier and the carrier structure can be specially designed as a ground bond.

The method according to the invention allows potential equalization between a circuit carrier of a control device and the housing of said control device to be established in a particularly simple manner. Initially, in particular a control device having a circuit carrier and a carrier structure or base plate are provided along with a connecting element and a contact-making element, wherein the contact-making element has a bondable surface coating.

Then, a, in particular force-fitting or interlocking, connection is established between the contact-making element and the carrier structure, wherein this connection is also electrically conductive. By way of example, a screw with a corresponding surface coating is screwed into a corresponding threaded opening in a housing base plate in this case.

Finally, an electrically conductive connection is then established between the contact-making element and the circuit carrier by means of the connecting element, for example a thick wire bond which is composed of aluminum.

Additional features and details of the invention can be gathered from the description of exemplary embodiments with reference to the drawing.

BRIEF DESCRIPTION OF THE DRAWING

The single FIGURE shows a partial cross section through an arrangement according to the invention.

DESCRIPTION OF THE INVENTION

A control device 1 for a motor vehicle, in particular a transmission control device, comprises a housing for accommodating an electrical component 6, a carrier structure 2, at least one side wall 8 and a cover, not shown here. The base plate 2 can also be integrally formed with the side wall 8.

The electrical component 6 is arranged, for example adhesively bonded or soldered, on a circuit carrier 4, for example a printed circuit board. The circuit carrier 4 for its part is arranged, in particular adhesively bonded, on the carrier structure, in particular a dimensionally stable base plate 2 which is composed of diecast aluminum.

In this case, the contact-making element is designed as a screw 7 in particular a hex head screw with a screw head having several different defined surfaces. In the FIGURE, only the top face of the screw head is provided with a bondable surface coating 5. In this case, the coated screw 7 is screwed into a corresponding threaded opening in the base plate 2 in a force-fitting and electrically conductive manner. In the FIGURE, the screw 7 is screwed into the threaded opening in the base plate 2 in such a way that, after the force-fitting connection has been established, the screw head is at a distance from the base plate 2. However, the screw head could also be screwed entirely into the base plate 2, as a result of which the electrically conductive surface between the screw 7 and the base plate 2 would be further increased.

An alternative type of connection between the contact-making element 7 and the base plate 2 to screwing would be, for example, riveting, soldering, welding or adhesive bonding.

The circuit carrier 4 is electrically conductively connected to the bondable surface coating 5 of the screw 7 by means of the connecting element 3. In particular, the connecting element is designed as a thick wire bond 3 which is composed of aluminum. However, any other type of wire or strip connection would also be possible as the connecting element 3, for example in the form of a thin aluminum wire, gold wire, copper wire, small copper strip or small aluminum strip.

According to the invention, metal or non-metal materials and materials which have not been able to be bonded to date and are electrically conductive can also be connected to one another at a defined potential and with a low contact resistance with process reliability or a greater degree of process reliability.

Differences in the material of housing components which are to be connected have significantly less influence on the bonding process in this case.

It is not necessary to specially mechanically process, for example mill, any region of a housing component in an extra step in order to be able to bond directly onto said region. Potential connection or potential equalization by several of these contact-making elements at various points on the housing is also possible.

The invention claimed is:

1. An arrangement for potential equalization in a control device for a motor vehicle, comprising:
    a carrier structure;
    a circuit carrier disposed on said carrier structure;
    at least one electrical component disposed on said circuit carrier; and
    at least one contact-making element protruding at least partially into said carrier structure;
    said at least one contact-making element connecting said circuit carrier to said carrier structure electrically conductively by way of a connecting element in order to establish potential equalization; and
    a bondable surface coating disposed on said contact-making element between said contact-making element and said connecting element.

2. The arrangement according to claim 1, wherein said surface coating is an electrodeposited coating or a chemically deposited coating on said contact-making element.

3. The arrangement according to claim 2, wherein said surface coating comprises a material selected from the group consisting of aluminum, copper, silver, and a compound thereof.

4. The arrangement according to claim 2, wherein said surface coating comprises a compound selected from the group consisting of nickel/gold, nickel/silver, nickel/palladium/gold and nickel/palladium/silver.

5. The arrangement according to claim 1, wherein said contact-making element is connected to said carrier structure with a force-fit or with a positively locking connection by way of a screw or rivet connection.

6. The arrangement according to claim 1, wherein said carrier structure is a part of a control device housing.

7. The arrangement according to claim 6, wherein said carrier structure is a base plate of said control device housing.

8. The arrangement according to claim 1, wherein said circuit carrier (4) is a printed circuit board.

9. The arrangement according to claim 1, wherein said circuit carrier is a printed circuit board with a ceramic substrate.

10. The arrangement according to claim 1, wherein said connecting element is a wire bond.

11. The arrangement according to claim 10, wherein said wire bond is a ground bond.

12. A control device for a motor vehicle, comprising the arrangement for potential equalization according to claim 1.

13. A method of producing an arrangement for potential equalization in a control device for a motor vehicle, the method comprising the following steps:
    providing a control device with a circuit carrier and a carrier structure;
    providing a contact-making element with a bondable surface coating, and an electrically conductive connecting element;
    establishing a force-fitting or positively locking connection between the contact-making element and the carrier structure, the connection being electrically conductive; and
    establishing an electrically conductive connection between the contact-making element and the circuit carrier by way of the connecting element.

14. The method according to claim 13, wherein the surface coating is electrodeposited or chemically deposited on the contact-making element.

15. An arrangement for potential equalization in a control device for a motor vehicle, comprising:
    a carrier structure;
    a circuit carrier disposed on said carrier structure;
    at least one electrical component disposed on said circuit carrier;
    a connecting element, said connecting element being a wire bond and said wire bond being a ground bond;
    at least one contact-making element protruding at least partially into said carrier structure and connecting said circuit carrier to said carrier structure electrically conductively by way of said connecting element in order to establish potential equalization;
    said at least one contact-making element having a bondable surface coating disposed on said contact-making element between said contact-making element and said connecting element, comprising a compound selected from the group consisting of nickel/gold, nickel/silver, nickel/palladium/gold and nickel/palladium/silver.

* * * * *